United States Patent [19]

Shimamura

[11] Patent Number: 4,707,609

[45] Date of Patent: Nov. 17, 1987

[54] EXPOSURE APPARATUS AND METHOD

[75] Inventor: Yoshinori Shimamura, Yokohama, Japan

[73] Assignee: Canon Kabushiki Kaisha, Tokyo, Japan

[21] Appl. No.: 823,732

[22] Filed: Jan. 29, 1986

[30] Foreign Application Priority Data

Jan. 31, 1985 [JP] Japan .................................. 60-15476
Jan. 31, 1985 [JP] Japan .................................. 60-15477

[51] Int. Cl.$^4$ .......................................... G21G 5/00
[52] U.S. Cl. ................................ 250/492.1; 250/492.2
[58] Field of Search ............... 250/492.1, 493.1, 494.1, 250/503.1, 504 R, 492.2; 315/88, 90, 151, 156, 157, 158, 159; 362/20

[56] References Cited

U.S. PATENT DOCUMENTS

| | | | |
|---|---|---|---|
| 2,590,513 | 3/1952 | Crossley et al. | 362/20 |
| 3,577,173 | 5/1971 | Bloomgren | 315/88 |
| 4,061,911 | 12/1977 | Krasin | 362/20 |
| 4,398,094 | 8/1983 | Hiramoto | 250/492.1 |
| 4,399,358 | 8/1983 | Burkhardt et al. | 250/237 G |
| 4,415,951 | 11/1986 | Necane et al. | 362/20 |

Primary Examiner—Carolyn E. Fields
Assistant Examiner—Paul A. Guss
Attorney, Agent, or Firm—Fitzpatrick, Cella, Harper & Scinto

[57] ABSTRACT

An exposure apparatus for exposing a first object to a radiation energy passed through a second object, having a pattern, thereby to transfer the pattern of the second object onto the first object, the exposure apparatus including a radiation energy source, at least one spare radiation energy source and an arrangement for substituting the first-mentioned radiation energy source by the second-mentioned, spare, radiation energy source when the service life of the first-mentioned radiation energy source becomes over or nearly over, wherein the spare radiation energy source is energized or actuated when the intensity of irradiation of the first-mentioned radiation energy source is decreased to a predetermined value and, at the same time or after elapse of a predetermined time, the first-mentioned radiation energy source is sustituted by the spare radiation energy source.

7 Claims, 3 Drawing Figures

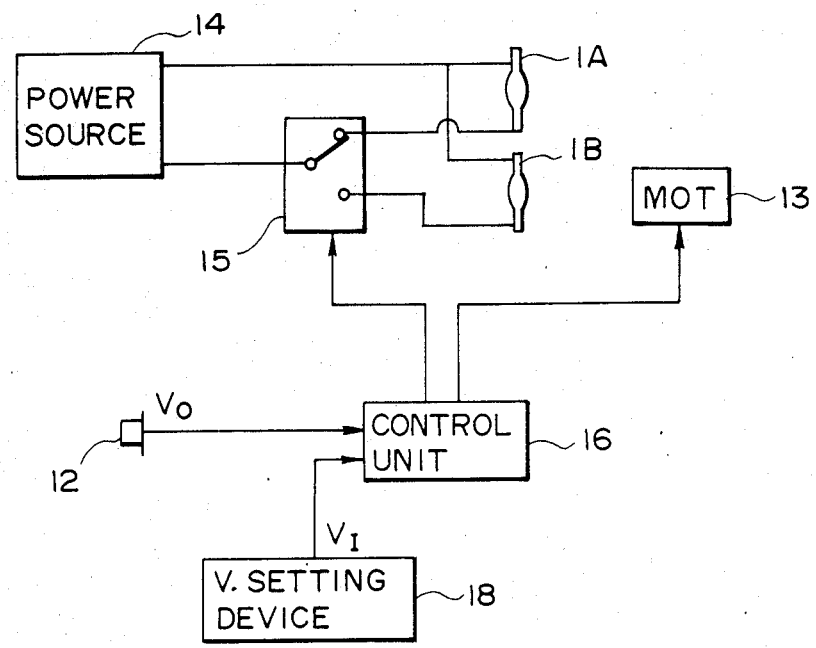
F I G. 2
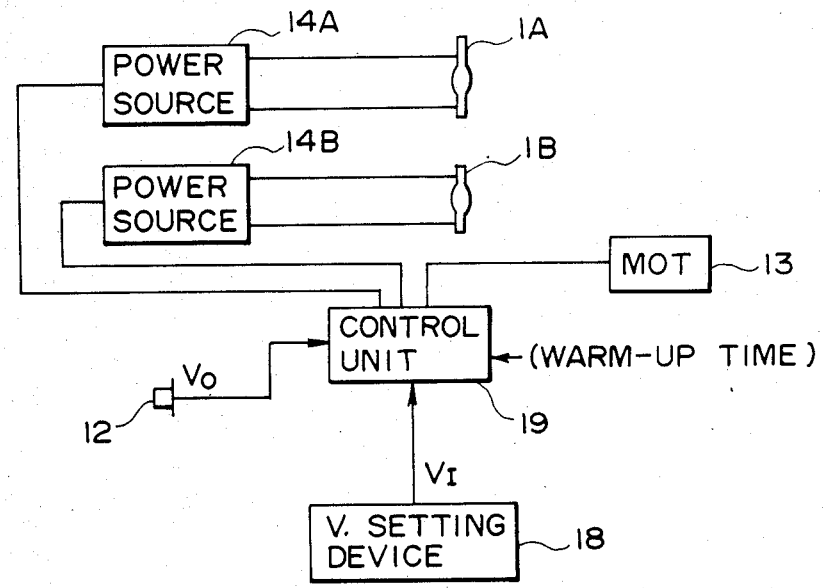
F I G. 3

EXPOSURE APPARATUS AND METHOD

FIELD OF THE INVENTION AND RELATED ART

This invention relates to an exposure apparatus and method and, more particularly, to a semiconductor device manufacturing exposure apparatus and method for exposing a radiation-sensitive layer, such as a photoresist layer, formed on a semiconductive substrate such as a semiconductor wafer to a radiation energy such as ultraviolet rays passed through a photomask or reticle having a circuit pattern, thereby to transfer the pattern of the photomask or reticle onto the semiconductor substrate.

Exposure apparatuses as above include a radiation energy source such as a Hg lamp or an X-ray generator. With elapse of time, the intensity of radiation energy produced from the source is gradually decreased. So, in conventional exposure apparatuses, the intensity of irradiation is measured by an operator by use of a measuring device and, if the intensity of irradiation of the lamp is decreased to a certain level, the lamp is replaced manually by a new one. Measurement of the intesity of irradiation and replacement of the lamp require complicated and time-consuming operations. And, during such operations, the exposure operation has to be interrupted. This leads to a loss of operational time for the exposure apparatus. Such loss of time is not preferable in respect to the throughput of the apparatus.

SUMMARY OF THE INVENTION

It is accordingly a primary object of the present invention to provide an exposure apparatus and method which assures significant reduction in time necessary for the replacement of a radiation energy source in the exposure apparatus, thereby to minimize the loss of time for the operation of the exposure apparatus.

It is another object of the present invention to provide an exposure apparatus and method, which avoids the necessity of complicated and time-consuming manual operations for the measurement of the intensity of irradiation of a radiation energy source of the exposure apparatus and for the replacement of the radiation energy source when its service life is over.

It is a further object of the present invention to provide an exposure apparatus and method, according to which the serviceability ratio can be improved significantly.

Briefly, according to one aspect of the present invention, there is provided an exposure apparatus for exposing a first object to a radiation energy passed through a second object, having a pattern, thereby to transfer the pattern of the second object onto the first object, the exposure apparatus including a radiation energy source, at least one spare radiation energy source and an arrangement for substituting the first-mentioned radiation energy source by the second-mentioned, spare, radiation energy source when the service life of the first-mentioned radiation energy source becomes over or substantially over, wherein the spare radiation energy source is energized or actuated when the intensity of irradiation of the first-mentioned radiation energy source is decreased to a predetermined value and, at the same time or after a predetermined time has elapsed, the first-mentioned radiation energy source is substituted by the spare radiation energy source.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 2 is a schematic and diagrammatic view showing an arrangement for exchanging lamps of the exposure apparatus according to the FIG. 1 embodiment.

FIG. 3 is a schematic and diagrammatic view showing an arrangement for exchanging lamps in a semiconductor device manufacturing exposure apparatus according to another embodiment of the present invention.

DESCRIPTION OF THE PREFERRED EMBODIMENTS

Figure 1:
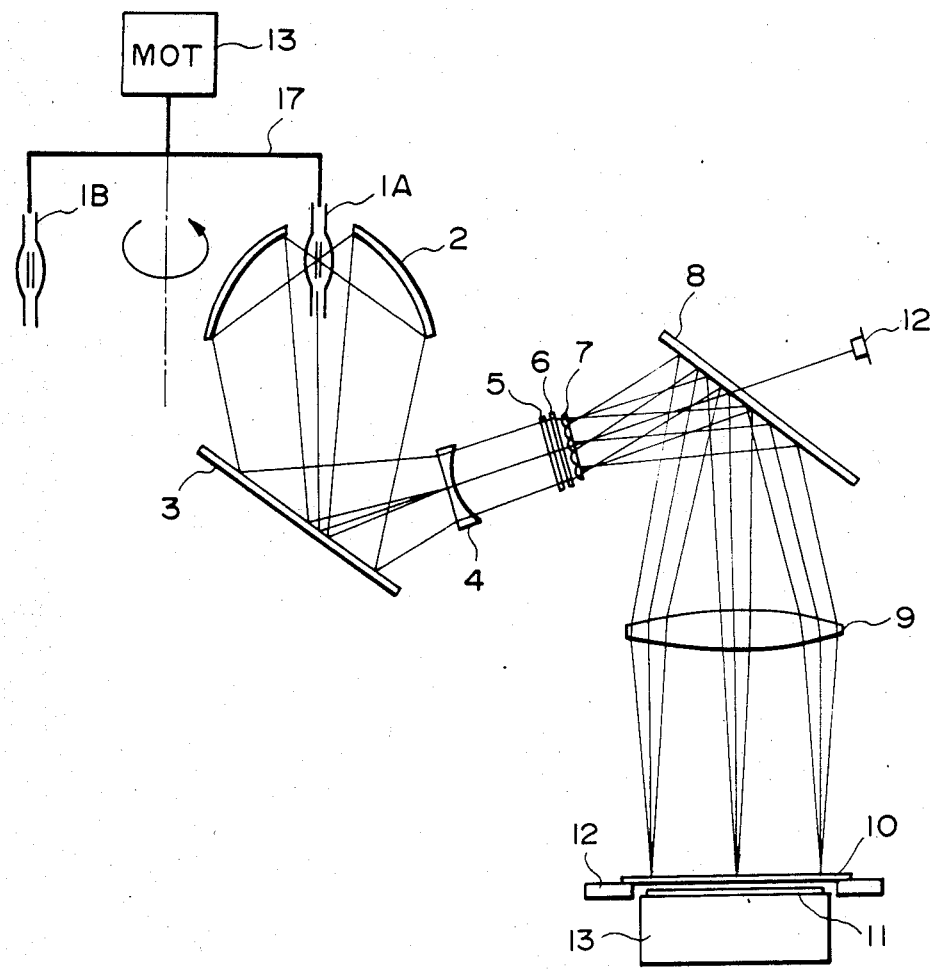
FIG. 1 is a schematic view of a semiconductor device manufacturing exposure apparatus according to one embodiment of the present invention.

Referring first to FIG. 1, there is shown an exposure apparatus for use in the manufacture of semiconductor devices. The exposure apparatus includes a radiation energy source 1A such as a super Hg lamp and an additional or spare radiation energy source 1B such as a super Hg lamp of the same kind as of the lamp 1A. Of these two lamps 1A and 1B, the lamp 1A is now being energized and so operated, while the lamp 1B is kept in reserve for possible use in case lamp 1A is broken or the service life of the lamp 1A is over.

The radiation energy which is a light beam in this embodiment produced by the lamp 1A is concentrated by an elliptical and concave mirror 2, and the light beam reflected from the mirror 2 is directed by a first mirror 3 to a collimator lens system 4. By the collimator lens system 4, the light beam is collimated and the collimated light beam passes through an ND filter 5 and an "L39" filter 6. The light beam emerging from the filter 6 is incident on a fly's eye lens or compound-eye lens 7, and the light beam passed through the lens 7 is directed downwardly as viewed in FIG. 1 by a second mirror 8 which comprises a half mirror. The downwardly directed light beam enters a condenser lens 9 and, after passing therethrough, it is incident on a mask 10 held by a mask holder 12 to illuminate it. The mask 10 has a circuit pattern formed thereon. A portion of the light beam passed through the mask 10 is incident on a semiconductor wafer 11 located under the mask 10 and held on a wafer stage 13. By this, a radiation sensitive layer such as a photoresist layer applied to the wafer 11 surface is exposed to the light passed through the mask 10 and, whereby, the circuit pattern of the mask 10 is transferred onto the wafer 11.

Disposed behind the second mirror (half mirror) 8 is a photoelectric converting element 12 such as a photodetector which is adapted to receive a portion of the light beam emerging from the fly's eye lens 7 and incident on the mirror 8, so as to detect the intensity of the light incident on the mirror 8. By this photodetector, the intensity of irradiation of the lamp 1A, which is being operated, can be monitored.

In this embodiment, the spare lamp 1B is preparatively set in its place within the exposure apparatus. By switching the power supply by use of a suitable relay, the spare lamp 1B can be energized or lighted in substitution for the lamp 1A. The lamps 1A and 1B are supported by a common support 17 which is schematically shown in FIG. 1. The support 17 is rotatable as denoted by an arrow in FIG. 1 about an axis. If necessary, the support 17 may be made translatable as well as rotatable. By the rotational movement and, if necessary, by the translation of the support 17, the positions of the lamps 1A and 1B are interchanged. By this, the lamps 1A and 1B can be selectively positioned accurately on the optical axis of the elliptical mirror 2.

Referring now to FIG. 2, a voltage source for producing a power for energizing selected one of the lamps 1A and 1B is denoted by numeral 14. Also, the relay for switching the power supply is denoted by numeral 15. Driving motor for moving the support 17 to exchange the lamps is denoted at 13 in FIG. 2.

The relay 15 and the motor 13 are controlled by a control unit 16 shown in FIG. 2. The control unit 16 is arranged to compare an output voltage V0 of the photodetector 12 with a set voltage V1 outputted from a voltage setting device 18. More specifically, a voltage which can be considered as being produced from the photodetector 12 in response to the intensity of irradiation of the lamp at the time of the end of the service life thereof (i.e. the lowermost intensity assuring satisfactory exposure) is preparatively set in the voltage setting device 18 as the set voltage V1. The output voltage V0 of the photodetector 12 corresponding to the actual intensity of irradiation is compared with the set voltage V1, in the control unit 16. If the intensity of irradiation of the lamp 1A is decreased with an increase in the working time of the lamp 1A, the output voltage V0 from the photodetector 12 is decreased accordingly. If V0 becomes equal to or less than V1, this is detected by the control unit 16. So, the control unit 16 simultaneously actuates the relay 15 and the motor 13, such that the power supply is switched to apply the voltage from the power source 14 to the spare lamp 1B to thereby light the same and such that the support 17 is rotated to move the spare lamp 1B to a position on the optical axis of the elliptical mirror 2, in place of the lamp 1A. By this, the operational state of the exposure apparatus is resumed.

In this embodiment, as described in the foregoing, the exposure apparatus is provided with one or more spare lamps in addition to a lamp which is being or going to be used. Further, the intensity of irradiation of the lamp being used is monitored so as to automatically detect the end of the service life of the lamp. When the intensity of the lamp being used is decreased to a level corresponding to the end of the service life, the lamp is automatically replaced by the spare lamp. This avoids the necessity of complicated and time-consuming manual operations required for measuring the intensity of irradiation of the lamp and for replacing the lamp by new one. As a result, exchange of lamps can be accomplished in a very short time, substantially without interrupting the operation of the exposure apparatus. This improves the serviceability ratio of the apparatus significantly.

FIG. 3 shows an arrangement for exchanging lamps, employed in a semiconductor device manufacturing exposure apparatus according to a second embodiment of the present invention.

The embodiment shown in FIG. 3 has a similar structure as of that of the first embodiment shown in FIGS. 1 and 2. So, the same reference numerals are assigned to elements having corresponding functions as of those of the first embodiment. In the present embodiment, however, the spare lamp 1B which is preparatively set in its place within the exposure apparatus and kept in reserve for possible use, is connected to its own power source so that it can be supplied with a voltage independently from the power supply to the lamp 1A being used.

In FIG. 3, the lamp 1A can be energized by a power supplied from its own power source 14A. On the other hand, the spare lamp 1B can be energized by a voltage supplied from its own power source 14B, separate from the power source 14A. Similarly to the first embodiment, a motor 13 is provided to rotate a common support 17 for the lamps 1A and 1B, so as to interchange the positions of the lamps 1A and 1B.

The power supply of the power sources 14A and 14B and the operation of the motor 13 are controlled by a control unit 19. That is, the control unit 19 is arranged to compare an output voltage V0 from a photoelectric converting element 12 such as a photodetector with a set voltage V1 outputted from a voltage setting device 18. In this embodiment, the set voltage V1 is determined while taking a warm-up time for the spare lamp 1B into account. More specifically, such voltage that can be considered as being produced from the photodetector 12 in response to a predetermined intensity of irradiation of the lamp which intensity is sufficiently higher than that unusable for the sake of exposure, has been preparatively set in the voltage setting device 18 as the set voltage V1. And, the output voltage V0 of the photodetector 12 corresponding to the actual intensity of irradiation is compared with the set voltage V1, in the control unit 16. Usually, a super Hg lamp requires a warm-up time of an order of 10–20 min. The information about the warm-up time has been preparatively stored into the control unit 19.

When the output voltage V0 of the photodetector 12 becomes equal to or less than the set voltage V1, this is detected by the control unit 19. And, the control unit 19 produces an instruction signal so as to supply the power of the power source 14B to the spare lamp 1B, thereby to start energization of the same. Subsequently, after elapse of time corresponding to the warm-up time for the lamp 1B, the control unit 19 produces instruction signals for extinguishing the lamp 1A and for actuating the motor 13 to rotate the support 17, simultaneously. By this, the sufficiently warmed-up lamp 1B is brought to the position right on the optical axis of the elliptical mirror 2, in substitution for the lamp 1A. The lamp 1A whose service life is over or nearly over is exchanged by a new lamp during the time period during which the lamp 1B is serviceable.

In accordance with the present invention, as described in the foregoing, the exposure apparatus is provided with one or more spare lamps in addition to a lamp which is being or just to be used. In response to an instruction signal instructing the exchange of lamps, the warm-up of one spare lamp is started so that the spare lamp is sufficiently warmed up before the intensity of irradiation of the lamp being used is decreased to a level unusable for the sake of exposure. After the warm-up of the spare lamp is completed, the spare lamp which is now being lighted is moved by the motor to a position right on the optical axis of the elliptical mirror, in place of the exposure lamp whose service life is over or nearly over. This eliminates the necessity of complicated and time-consuming manual operations for measuring the intensity of irradiation of the lamp and for replacing the lamp with new one. What is required is only a very short time necessary for exchanging the lamps by the motor. As a result, the operation of the exposure apparatus is substantially uninterrupted. Therefore, the serviceability ratio of the apparatus can be improved significantly.

In the second embodiment, as described, the warm-up of the spare lamp 1B is initiated automatically by the control unit 19 when the output voltage V0 of the photodetector 12 becomes equal to or less than the set voltage V1. This may be however modified. That is, the output voltage V0 of the photodetector 12 may be displayed in a suitable display and a manually operable switch may be provided, such that, when the voltage V0 is decreased to a predetermined value, the manually operable switch is manually operated to apply an instruction signal to the control unit 19 to start the warm-up of the spare lamp. It is a possible alternative that such voltage that can be considered as being produced from the photodetector 12 in response to the intesity of irradiation substantially corresponding to the end of the service life of the lamp, is set in the voltage setting device 18 as the set voltage V1. Alternatively, such time which is earlier than the time of expiration of the service life by a period of time substantially corresponding to the warm-up time of the spare lamp as expected by calculation, is set in the control unit 19, on the basis of the decreasing function or rate of the output V0 of the photodetector 12 and the set warm-up time. The instruction signal for instructing exchange of lamp is, in this case, produced at a timing corresponding to the expected time.

While in the foregoing embodiments the invention has been described with reference to an exposure apparatus which is provided with one spare lamp, two or more spare lamps may be provided. In such case, the spare lamps may be used sequentially. Also, as for the manner of exchange, the invention is not limited to a rotary type using rotational movement of the support 17. A reciprocating support displaceable linearly may be employed to exchange the lamps.

Where an X-ray generator is used as the radiation energy source, the photodetector disclosed in the embodiments is replaced by a suitable X-ray detecting device.

While the invention has been described with reference to the structures disclosed herein, it is not confined to the details set forth and this application is intended to cover such modifications or changes as many come within the purposes of the improvements or the scope of the following claims.

What is claimed is:

1. An exposure apparatus for exposing a first object to a radiation energy passed through a second object, said apparatus comprising:
   means for holding the first object;
   means for holding the second object;
   first radiation energy source means for producing a radiation energy to irradiate the second object with the radiation energy, so that the first object is exposed to the radiation energy passed through the second object;
   at least one additional radiation energy source means kept in reserve for possible use in place of said first radiation energy source;
   instructing means for producing an instruction signal to instruct exchange of said first radiation energy source means and said additional radiation energy source means; and
   exchanging means operative, in response to the instruction signal from said instructing means, to energize said additional radiation energy source means and, after a predetermined time has elapsed, to displace said first radiation energy source means from a first position for irradiating the second object to a second position, and to displace said additional radiation energy source means to the first position in its energized state.

2. An apparatus according to claim 1, further comprising means for manually operating said instructing means to produce the instruction signal.

3. An apparatus according to claim 1, wherein said instructing means comprises means for detecting the intensity of irradiation of said first radiation energy source means when the same is energized and to produce the instruction signal when the intensity of irradiation of said first radiation energy source means comes into a predetermined relation with a predetermined value.

4. A method of exposing a first object to a radiation energy passed through a second object, said method comprising:
   irradiating the second object with a radiation energy emitted from a first radiation energy source so that the first object is exposed to the radiation energy passed through the second object;
   detecting the intensity of irradiation of the first radiation energy source;
   energizing an additional radiation energy source kept in reserve for possible use in place of the first radiation energy source, when the detected intensity of irradiation of the first radiation energy source decreases to a predetermined value;
   displacing the first radiation energy source from a first position for irradiating the second object to a second position, and displacing the energized additional radiation energy source to the first position, when a predetermined time has elapsed after the intensity of irradiation of the first radiation energy source has decreased to a predetermined value; and
   irradiating the second object with a radiation energy emitted from the additional radiation energy source so that the first object is exposed to the radiation energy passed through the second object.

5. An exposure apparatus for exposing a first object to a radiation energy passed through a second object, said apparatus comprising:
   means for holding the first object;
   means for holding the second object;
   first radiation energy source means for producing a radiation energy to irradiate the second object with the radiation energy, so that the first object is exposed to the radiation energy passed through the second object;
   at least one additional radiation energy source means kept in reserve for possible use in place of said first radiation energy source; and
   control means for energizing said additional radiation energy source means and for starting, after a predetermined period of time has elapsed, irradiation of the second object with said additional radiation energy source.

6. An apparatus according to claim 5, wherein said control means comprises means for stoping the irradiation of the second object with said first radiation energy source means substantially simultaneously with the start of the irradiation of the second object with said additional radiation energy source means.

7. An apparatus according to claim 5, wherein said control means comprises means for displacing said additional radiation energy source means to a position for irradiating the second object for starting the irradiation of the second object with said additional radiation energy source means.

* * * * *

UNITED STATES PATENT AND TRADEMARK OFFICE
CERTIFICATE OF CORRECTION

PATENT NO. : 4,707,609  
DATED : November 17, 1987  
INVENTOR(S) : YOSHINORI SHIMAMURA Page 1 of 2

It is certified that error appears in the above-identified patent and that said Letters Patent is hereby corrected as shown below:

AT [56] IN THE REFERENCES

"3,577,173   5/1971   Bloomgren ..... 315/88" should read  
--3,577,173   5/1971   Blomgren ..... 315/88--.  
"4,415,951   11/1986   Necane et al. ..... 362/20" should read --4,415,951   11/1986   Recane et al. ..... 362/20--.

AT [57] IN THE ABSTRACT

Line 8, "spare," should read --spare--.  
Line 16, "sustituted" should read --substituted--.

COLUMN 1

Line 59, "spare," should read --spare--.

COLUMN 2

Line 50, "radiation sensitive" should read --radiation-sensitive--.

COLUMN 3

Line 53, "by new" should read --by a new--.

COLUMN 4

Line 52, "just" should read --about--.

UNITED STATES PATENT AND TRADEMARK OFFICE
CERTIFICATE OF CORRECTION

PATENT NO. : 4,707,609

DATED : November 17, 1987

INVENTOR(S) : YOSHINORI SHIMAMURA

It is certified that error appears in the above-identified patent and that said Letters Patent is hereby corrected as shown below:

COLUMN 5

Line 15, "intesity" should read --intensity--.
    Line 43, "many" should read --may--.

COLUMN 6

Line 50, "source;" should read --source means;--.
    Line 55, "source." should read --source means.--.
    Line 57, "stoping" should read --stopping--.

Signed and Sealed this

Nineteenth Day of July, 1988

Attest:

DONALD J. QUIGG

*Attesting Officer*    *Commissioner of Patents and Trademarks*